United States Patent
Thakur

(10) Patent No.: US 9,214,942 B2
(45) Date of Patent: Dec. 15, 2015

(54) LOW OUTPUT IMPEDANCE, LOW POWER BUFFER

(71) Applicant: Nishant Singh Thakur, Indore (IN)

(72) Inventor: Nishant Singh Thakur, Indore (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 174 days.

(21) Appl. No.: 14/182,240

(22) Filed: Feb. 17, 2014

(65) Prior Publication Data

US 2015/0236674 A1    Aug. 20, 2015

(51) Int. Cl.
  *H03K 3/00*         (2006.01)
  *H03K 19/0948*      (2006.01)
  *H03K 19/0185*      (2006.01)

(52) U.S. Cl.
  CPC .... *H03K 19/0948* (2013.01); *H03K 19/018521* (2013.01)

(58) Field of Classification Search
  USPC ......................................................... 327/108
  See application file for complete search history.

(56) References Cited

U.S. PATENT DOCUMENTS

| | | |
|---|---|---|
| 5,361,041 A | 11/1994 | Lish |
| 5,959,475 A | 9/1999 | Zomorrodi |
| 6,222,403 B1 * | 4/2001 | Mitsuda ........... H03K 19/00361 326/26 |
| 6,717,445 B1 | 4/2004 | Nair |
| 7,019,584 B2 | 3/2006 | Bartel |
| 7,170,351 B2 | 1/2007 | Shimatani |
| 7,368,994 B2 | 5/2008 | Franck |
| 7,675,315 B2 | 3/2010 | Tadeparthy |
| 8,022,765 B1 | 9/2011 | Oo |
| 2010/0182086 A1 | 7/2010 | Cozzolino |

* cited by examiner

*Primary Examiner* — Lincoln Donovan
*Assistant Examiner* — Patrick Chen
(74) *Attorney, Agent, or Firm* — Charles Bergere

(57) ABSTRACT

A complementary push-pull buffer includes complementary transconductance (GM) devices connected as source-followers to drive a load. Current flowing through the GM devices is split, on the source side, between constant-current source circuitry and a push signal current multiplier (e.g., a current mirror) and, on the sink side, between constant-current sink circuitry and a pull signal current multiplier. The devices used to implement the constant-current circuits and the current multipliers are sized such that the current multipliers provide low output impedance, while the current splitting provides low overall power consumption.

12 Claims, 5 Drawing Sheets

LOW OUTPUT IMPEDANCE, LOW POWER BUFFER

BACKGROUND OF THE INVENTION

The present invention relates generally to integrated circuits, and more particularly to buffers such as complementary push-pull buffers.

Complementary push-pull buffers offer low output impedance to drive large capacitive or resistive loads. In some applications, it is desirable for a push-pull buffer to have extremely low output impedance, e.g., in order to drive a very large capacitance load or a very low resistance load, and low bias current, e.g., in order to conserve power.

FIG. 1 shows a schematic diagram of a conventional complementary push-pull buffer 100 that converts an input signal INPUT into an output signal OUTPUT. The push-pull buffer 100 has two main transconductance (GM) devices: N-type (e.g., NMOS) source transistor N30 and P-type (e.g., PMOS) sink transistor P50, both of which are configured as a complementary source-follower stage to drive output.

P-type source-follower biasing circuitry 110, consisting of P-type transistors P12, P14, and P16 and N-type transistor N18, biases the input signal INPUT to drive GM source device N30, while N-type source-follower biasing circuitry 120, consisting of N-type transistors N22, N24, and N26 and P-type transistor P28, biases the input signal INPUT to drive GM sink device P50.

Current-mirror source circuitry 140, consisting of P-type transistors P42, P44, and P46, is connected to GM source device N30 such that the input (master) stage (i.e., device P42) of the current-mirror source circuitry 140 is connected in series with GM source device N30, while the output (slave) stage (i.e., device P46) of the current-mirror source circuitry 140 is connected in parallel with the series combination of devices N30 and P42.

Similarly, current-mirror sink circuitry 160, consisting of N-type transistors N62, N64, and N66, is connected to GM sink device P50 such that the input (master) stage (i.e., device N62) of the current-mirror sink circuitry 160 is connected in series with GM sink device P50, while the output (slave) stage (i.e., device N64) of the current-mirror sink circuitry 160 is connected in parallel with the series combination of devices P50 and N62.

With this configuration, substantially all of the current that flows through GM devices N30 and P50 also flows through current-mirror master devices P42 and N62. Devices P14, N18, N24, P28, P44, and P66 are power-down devices that are only used to turn the buffer 100 off when it is not in use. When the buffer 100 is in use, devices P44 and N66 (as well as devices N18 and P28) remain off, while devices P14 and N24 remain on.

As known in the art, current mirrors in the output stage are used to reduce output impedance of the complementary source-follower stage. As indicated in FIG. 1, the devices used to implement each set of the current-mirror circuitry 140 and 160 are sized such that each mirrored, output-stage current is 60 times larger than the input-stage current. This relatively large multiplication factor is selected to provide an acceptably low level of output impedance for certain applications of the buffer 100.

Unfortunately, the large multiplication factor also increases the power consumption of the buffer 100. In the exemplary implementation of FIG. 1, since the main GM devices N30 and P50 draw 16 microamps (uA), the 60× multiplication factor means that the output stages of the current mirrors draw 960 uA, which may be too much power consumption for some applications of the buffer 100.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a buffer circuit comprising (a) first main transconductance circuitry connected to convert an input signal into an output signal at an output node of the buffer circuit, (b) first constant-current circuitry configured to generate a first constant current and connected in series with the first main transconductance circuitry, and (c) first current-multiplier circuitry connected to the first main transconductance circuitry and to the first constant-current circuitry such that current flowing through the first main transconductance circuitry is split between (i) the first constant current flowing through the first constant-current circuitry and (ii) first remaining current applied to the first current-multiplier circuitry.

Figure 1:
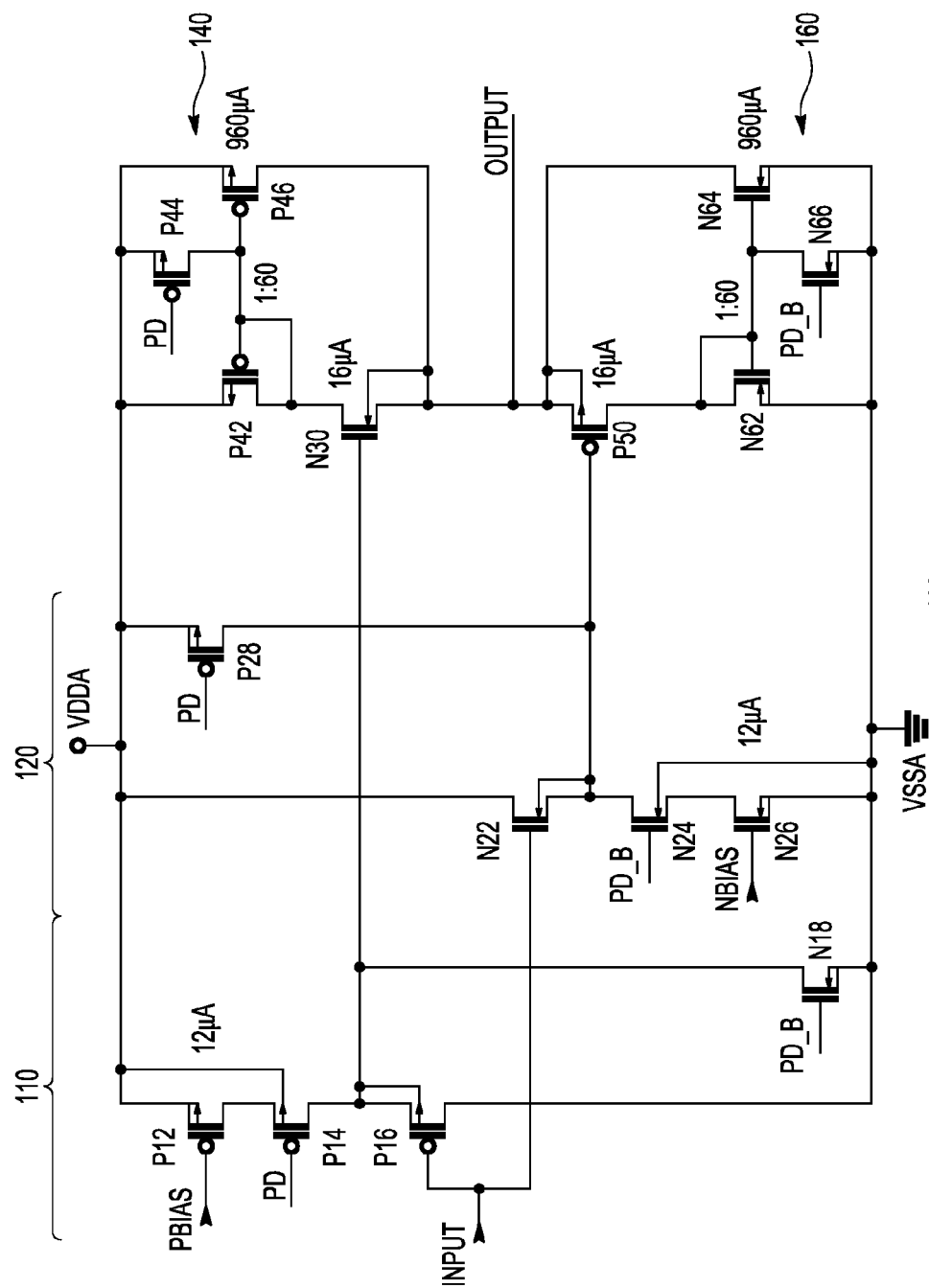
FIG. 1 shows a schematic circuit diagram of a conventional complementary push-pull buffer.
Figure 2:
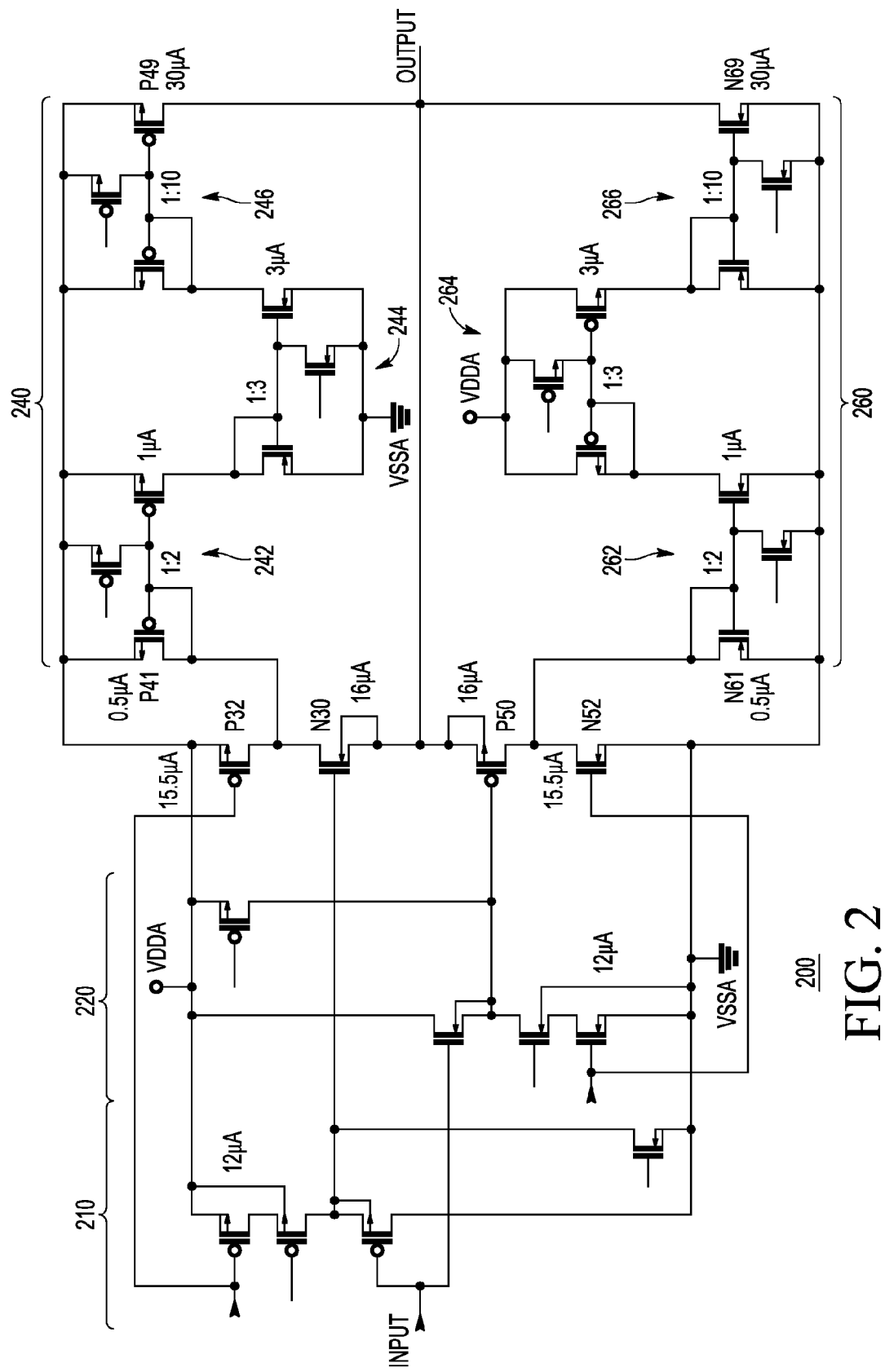
FIG. 2 shows a schematic circuit diagram of a complementary push-pull buffer according to an exemplary embodiment of the present invention.

FIG. 2 shows a schematic diagram of a complementary push-pull buffer 200 that converts an input signal INPUT into an output signal OUTPUT, according to an exemplary embodiment of the present invention. Like the push-pull buffer 100 of FIG. 1, the push-pull buffer 200 has two main transconductance devices: N-type (e.g., NMOS) GM source transistor N30 and P-type (e.g., PMOS) GM sink transistor P50, both of which are configured as source-followers to convert voltage to current.

Analogous to the push-pull buffer 100 of FIG. 1, P-type source-follower biasing circuitry 210 biases the input signal INPUT to drive GM source device N30, while N-type source-follower biasing circuitry 220 biases the input signal INPUT to drive GM sink device P50.

However, unlike the push-pull buffer 100 of FIG. 1, in addition to being connected in series to current-mirror source circuitry 240, GM source device N30 is also connected in series with P-type constant-current source device P32. Similarly, in addition to being connected in series to current-mirror sink circuitry 260, GM sink device P50 is also connected in series with N-type constant-current sink device N52.

Devices P32 and N52 used to implement the two sets of constant-current circuitry 240 and 260 and the devices used to implement the two sets of current-mirror circuitry 240 and 260 are sized such that most of the current that flows through each GM device N30, P50 flows through the corresponding constant-current circuitry, while only a small fraction of that current flows through the input stage of the corresponding current-mirror circuitry. In particular, in an exemplary implementation of the push-pull buffer 200 of FIG. 2, 15.5 uA of the 16 uA that flows through GM source device N30 flows through constant-current source circuitry P32, while only the remaining 0.5 uA flows through the input stage (i.e., device P41) of current-mirror source circuitry 240. Similarly, 15.5 uA of the 16 uA that flows through GM sink device P50 flows through constant-current sink circuitry N52, while only the remaining 0.5 uA flows through the input stage (i.e., device N61) of the current-mirror sink circuitry 260.

In this exemplary implementation of FIG. 2, as in the push-pull buffer 100 of FIG. 1, each set of the current-mirror circuits 240, 260 provides a 1:60 ratio of the input-stage current (through device P41, N61) to the final, mirrored, output-stage current (through device P49, N69). Since the input-stage current is only 0.5 uA in FIG. 2, the mirrored output current is only 30 uA, compared to the 960 uA output current of the corresponding the conventional push-pull buffer 100 of FIG. 1. Since both embodiments provide a 1:60 current-mirror ratio, the output impedances of the two embodiments are roughly the same, but, as indicated by the various current levels in FIGS. 1 and 2, the overall power consumption of the push-pull buffer 200 (i.e., 12 uA+12 uA+16 uA+1 uA+3 uA+30 uA=74 uA) is about 13 times lower than the overall power consumption of the conventional push-pull buffer 100 (i.e., 12 uA+12 uA+16 uA+960 uA=1 mA).

Note that, in the particular implementation shown in FIG. 2, the current-mirror source circuitry 240 is implemented using three stages of cascaded current mirrors 242, 244, and 246 having current-mirror ratios of 1:2, 1:3, and 1:10, respectively, for an overall ratio of 1:60. Similarly, the current-mirror sink circuitry 260 is implemented using three cascaded current-mirrors 262, 264, and 266 having current-mirror ratios of 1:2, 1:3, and 1:10, respectively, for an overall ratio of 1:60. Those skilled in the art will understand that, in alternative implementations, any suitable number of current mirrors having any suitable current-mirror ratios or any suitable number of stages can be used to implement each set of current-mirror circuitry.

Since devices P32 and N52 function as constant-current devices, when the input signal INPUT corresponds to a relatively small AC voltage superimposed on a larger DC voltage, substantially all of the AC current generated by GM devices N30 and P50 gets applied to the current-mirror circuits 240 and 260.

Another advantage of using current mirrors is that the nodes in mirror stage paths like mirrors 244, 246, 262, and 266 have diode-connected devices, thus offering low impedance without introducing low-frequency poles that can affect the stability of the system in which the buffer 200 is used.

Figure 3:
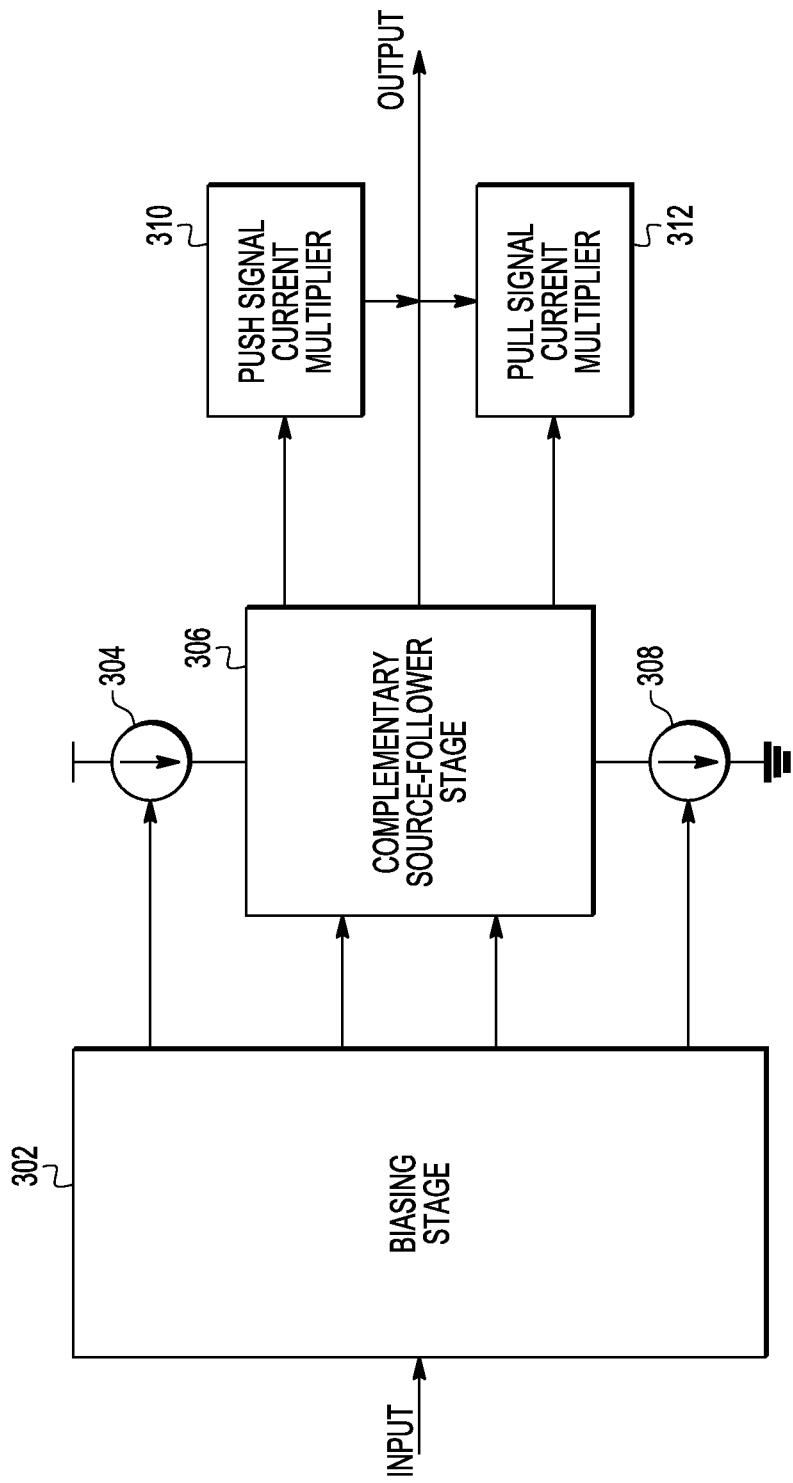
FIG. 3 shows a schematic block diagram of a generalized push-pull buffer according to certain embodiments of the present invention.

FIG. 3 shows a block diagram of a generalized push-pull buffer 300 that converts an input signal INPUT into an output signal OUTPUT according to certain embodiments of the present invention. A biasing stage 302 biases the input signal INPUT for application to a complementary source-follower stage 306. Current flowing through the complementary source-follower stage 306 is split between constant-current source circuitry 304 and push signal current multiplier 310. Similarly, current flowing through complementary source-follower stage 306 is split between constant-current sink circuitry 308 and pull signal current multiplier 312.

The devices used to implement the constant-current circuitries 304 and 308 and the current multipliers 310 and 312 are sized such that the current multiplication factors applied by current multipliers 310 and 312 provide an output impedance sufficiently low for the particular application of push-pull buffer 300, while the current splitting keeps the overall power consumption level of push-pull buffer 300 to a sufficiently low level for that application.

The push-pull buffer 200 of FIG. 2 is just one possible implementation of the generalized push-pull buffer 300 of FIG. 3, where:
  Biasing circuitries 210 and 220 of FIG. 2 form one exemplary implementation biasing stage 302 of FIG. 3, which can be implemented using any suitable set of biasing circuitry;
  GM devices N30 and P50 of FIG. 2 form one exemplary implementation of complementary source-follower stage 306 of FIG. 3, which can be implemented using any suitable set of transconductance circuitry;
  Constant-current devices P32 and N52 of FIG. 2 form exemplary implementations of constant-current circuitries 304 and 308 of FIG. 3, which can be implemented using any suitable sets of constant-current circuitry; and
  Current-mirror circuitries 240 and 260 of FIG. 2 form exemplary implementations of current multipliers 310 and 312 of FIG. 3, which can be implemented using any suitable sets of current-multiplying circuitry.

Although the invention has been described in the context of complementary push-pull buffers, the invention can also be implemented as a one-sided buffer, e.g., either a push buffer or a pull buffer.

Figure 4:
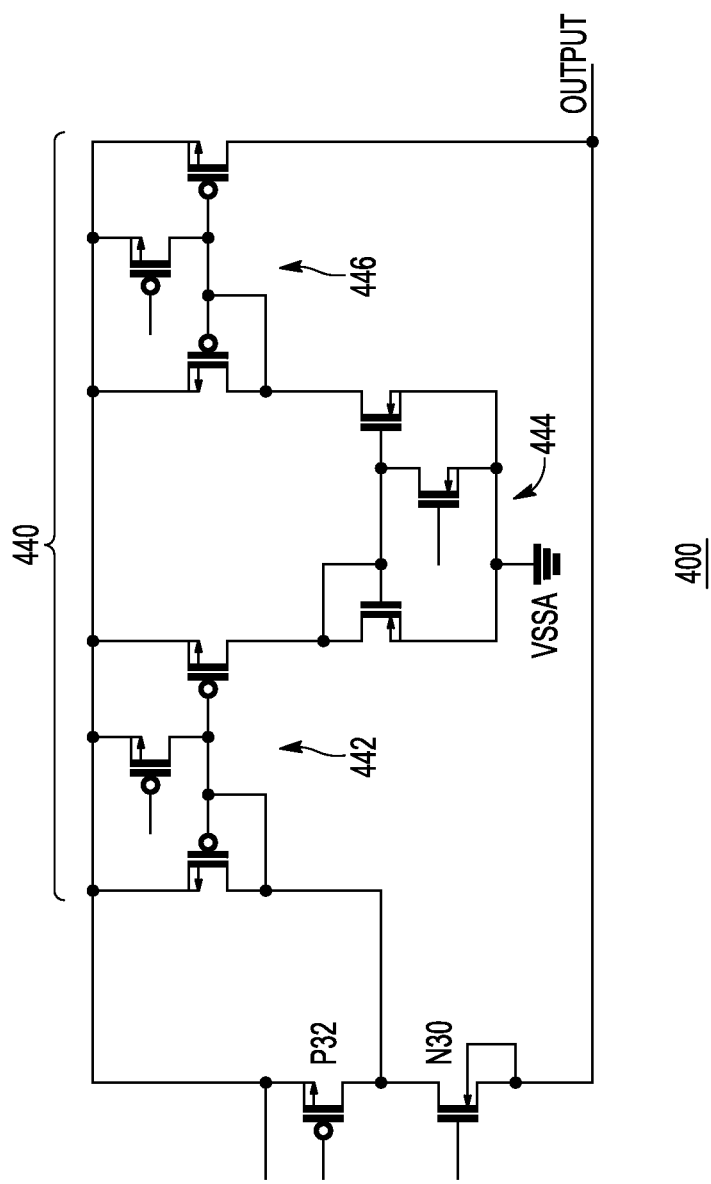
FIG. 4 shows schematic circuit diagram of an exemplary implementation of a portion of a one-sided, push buffer according to one embodiment of the present invention.

FIG. 4 shows an exemplary implementation of a portion of a push buffer 400 according to one embodiment of the invention. In particular, FIG. 4 shows N-type GM source device N30 connected to both constant-current source device P32 and current-mirror source circuitry 440, which comprises three cascaded current mirrors 442, 444, and 446. As in complementary push-pull buffer 200 of FIG. 2, in push buffer 400, source current flowing through GM source device N30 is split between constant-current source device P32 and the initial master stage of current-mirror source circuitry 440. As before, the devices can be sized to keep the output impedance low, while still providing low overall power consumption. FIG. 4 does not show the biasing circuitry for push buffer 400, which could be similar to biasing circuitry 210 of FIG. 2.

Figure 5:
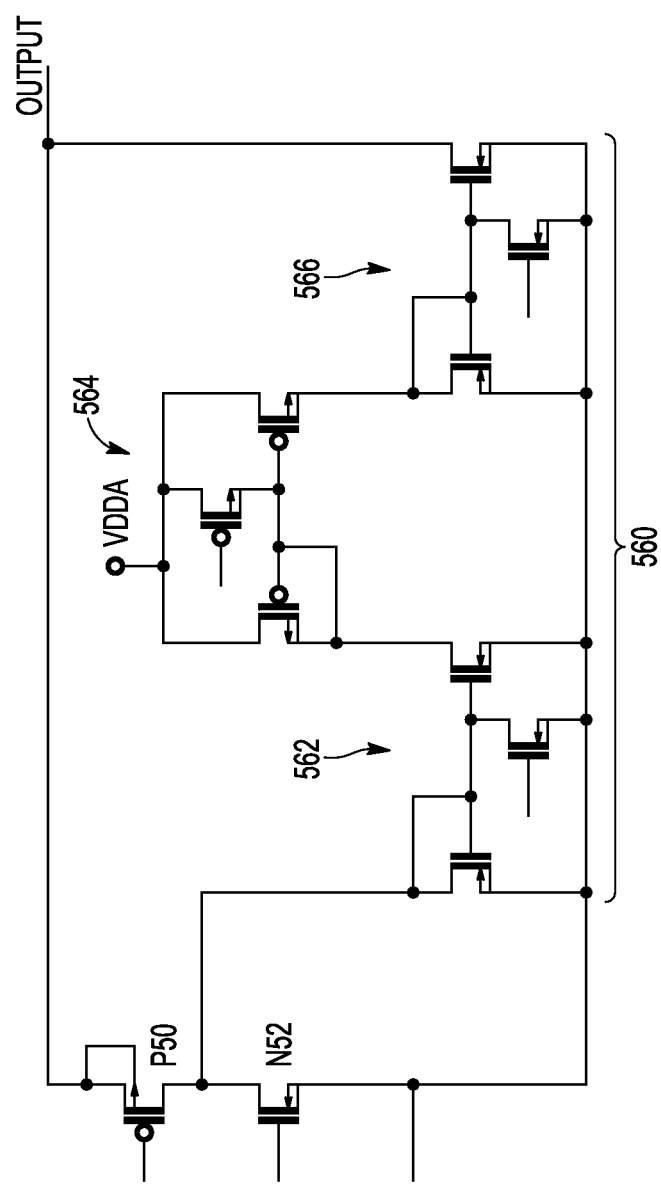
FIG. 5 shows a schematic circuit diagram of an exemplary implementation of a portion of a one-sided, pull buffer according to one embodiment of the present invention.

FIG. 5 shows an exemplary implementation of a portion of a pull buffer 500 according to one embodiment of the invention. In particular, FIG. 5 shows P-type GM sink device P50 connected to both constant-current sink device N52 and current-mirror source circuitry 560, which comprises three cascaded current mirrors 562, 564, and 566. As in complementary push-pull buffer 200 of FIG. 2, in pull buffer 500, sink current flowing through GM sink device P50 is split between constant-current sink device N52 and the initial master stage of current-mirror sink circuitry 560. As before, the devices can be sized to keep the output impedance low, while still providing low overall power consumption. FIG. 5 does not show the biasing circuitry for pull buffer 500, which could be similar to biasing circuitry 220 of FIG. 2.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi polar device when an embodiment of the invention is implemented using bi-polar transistor technology.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A buffer circuit, comprising:
   first main transconductance circuitry connected to convert an input signal into an output signal at an output node of the buffer circuit;
   first constant-current circuitry, connected in series with the first main transconductance circuitry, configured to generate a first constant current; and
   first current-multiplier circuitry connected to the first main transconductance circuitry and to the first constant-current circuitry such that current flowing through the first main transconductance circuitry is split between (i) the first constant current flowing through the first constant-current circuitry and (ii) first remaining current applied to the first current-multiplier circuitry,
   wherein the first current-multiplier circuitry comprises current-mirror circuitry that includes two or more cascaded current mirrors.

2. The buffer circuit of claim 1, further comprising biasing circuitry connected to bias the input signal for application to the first main transconductance device.

3. The buffer circuit of claim 1, wherein:
   an input stage of the first current-multiplier circuitry is connected in parallel with the first constant-current circuitry and in series with the first main transconductance circuitry; and
   an output stage of the first current-multiplier circuitry is connected in parallel with the series combination of the first constant-current circuitry and the first main transconductance circuitry.

4. The buffer circuit of claim 1, wherein devices used to implement the first constant-current circuitry and the first current-multiplier circuitry are sized such that more of the current flowing through the first main transconductance circuitry flows through the first constant-current circuitry as the first constant current than is applied to the first current-multiplier circuitry as the first remaining current.

5. The buffer circuit of claim 1, wherein:
   the first main transconductance circuitry is an N-type device;
   the first constant-current circuitry is a P-type constant-current source device; and
   the first current-multiplier circuitry is current-mirror source circuitry.

6. The buffer circuit of claim 1, wherein:
   the first main transconductance circuitry is a P-type device;

the first constant-current circuitry is an N-type constant-current sink device; and the first current-multiplier circuitry is current-mirror sink circuitry.

7. The buffer circuit of claim 1, further comprising:

complementary main transconductance circuitry connected in series with the first main transconductance circuitry to convert the input signal into the output signal at the output node of the buffer circuit;

complementary constant-current circuitry configured to generate a complementary constant current and connected in series with the complementary main transconductance circuitry; and complementary current-multiplier circuitry connected to the complementary main transconductance circuitry and to the complementary constant-current circuitry such that current flowing through the complementary main transconductance circuitry is split between (i) the complementary constant current flowing through the complementary constant-current circuitry and (ii) complementary remaining current applied to the complementary current-multiplier circuitry.

8. The buffer circuit of claim 7, wherein:

an input stage of the first current-multiplier circuitry is connected in parallel with the first constant-current circuitry and in series with the first main transconductance circuitry;

an output stage of the first current-multiplier circuitry is connected in parallel with the series combination of the first constant-current circuitry and the first main transconductance circuitry;

an input stage of the complementary current-multiplier circuitry is connected in parallel with the complementary constant-current circuitry and in series with the complementary main transconductance circuitry; and an output stage of the complementary current-multiplier circuitry is connected in parallel with the series combination of the complementary constant-current circuitry and the complementary main transconductance circuitry.

9. The buffer circuit of claim 7, wherein:

devices used to implement the first constant-current circuitry and the first current-multiplier circuitry are sized such that more of the current flowing through the first main transconductance circuitry flows through the first constant-current circuitry as the first constant current than is applied to the first current-multiplier circuitry as the first remaining current; and devices used to implement the complementary constant-current circuitry and the complementary current-multiplier circuitry are sized such that more of the current flowing through the complementary main transconductance circuitry flows through the complementary constant-current circuitry as the complementary constant current than is applied to the complementary current-multiplier circuitry as the complementary remaining current.

10. The buffer circuit of claim 7, wherein:

the complementary current-multiplier circuitry comprises complementary current-mirror circuitry.

11. The buffer circuit of claim 10, wherein:

the complementary current-mirror circuitry comprises two or more cascaded current mirrors.

12. The buffer circuit of claim 7, wherein:

the first main transconductance circuitry is an N-type device;

the first constant-current circuitry is a P-type constant-current source device;

the first current-multiplier circuitry is current-mirror source circuitry;

the complementary main transconductance circuitry is a P-type device;

the complementary constant-current circuitry is an N-type constant-current sink device; and the complementary current-multiplier circuitry is current-mirror sink circuitry.

* * * * *